United States Patent
Marshall et al.

(10) Patent No.: US 7,085,977 B2
(45) Date of Patent: Aug. 1, 2006

(54) METHOD AND SYSTEM FOR DETECTING AN OUTLYING RESISTANCE IN A PLURALITY OF RESISTIVE ELEMENTS

(75) Inventors: Andrew Marshall, Dallas, TX (US); C. Keith Burgess, Richardson, TX (US); Charles D. Weinberger, McKinney, TX (US); Madhu Sayala, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 615 days.

(21) Appl. No.: 10/011,220

(22) Filed: Oct. 25, 2001

(65) Prior Publication Data

US 2002/0078409 A1  Jun. 20, 2002

Related U.S. Application Data

(60) Provisional application No. 60/256,886, filed on Dec. 19, 2000.

(51) Int. Cl.
*G01R 31/28* (2006.01)
*G01R 31/02* (2006.01)

(52) U.S. Cl. .............. 714/726; 714/724; 324/763
(58) Field of Classification Search ............. 714/724, 714/726, 727, 734; 324/754, 763, 765
See application file for complete search history.

(56) References Cited

U.S. PATENT DOCUMENTS

| | | | |
|---|---|---|---|
| 5,418,453 A * | 5/1995 | Wise | 324/160 |
| 6,218,848 B1 * | 4/2001 | Hembree et al. | 324/754 |
| 6,259,267 B1 * | 7/2001 | Fujiwara | 324/765 |
| 6,677,744 B1 * | 1/2004 | Long | 324/158.1 |

* cited by examiner

*Primary Examiner*—James C. Kerveros
(74) *Attorney, Agent, or Firm*—Rose Alyssa Keagy; W. James Brady, III; Frederick J. Telecky, Jr.

(57) ABSTRACT

In one aspect of the invention, a semiconductor die includes a plurality of resistive elements operable to receive a voltage differential between at least two of the resistive elements. The semiconductor die also includes a test circuit coupled to at least three tap points along the resistive elements. The test circuit is operable to measure a voltage at at least two of the tap points. A difference in the voltages between the at least two tap points is proportional to a resistance of the one or more resistive elements between the at least two tap points.

20 Claims, 4 Drawing Sheets

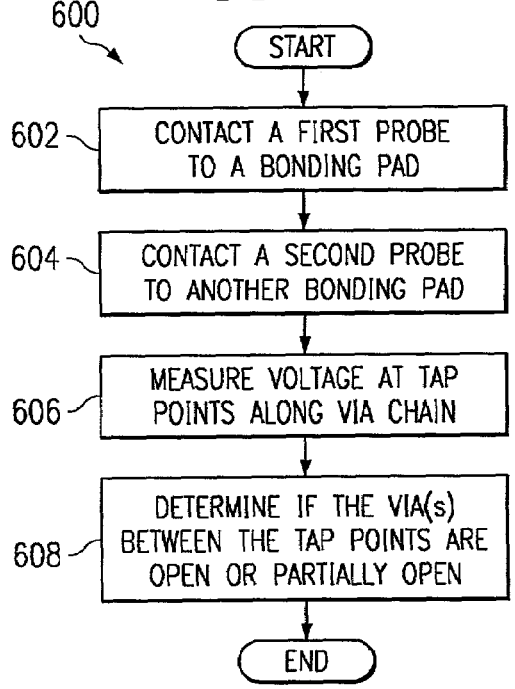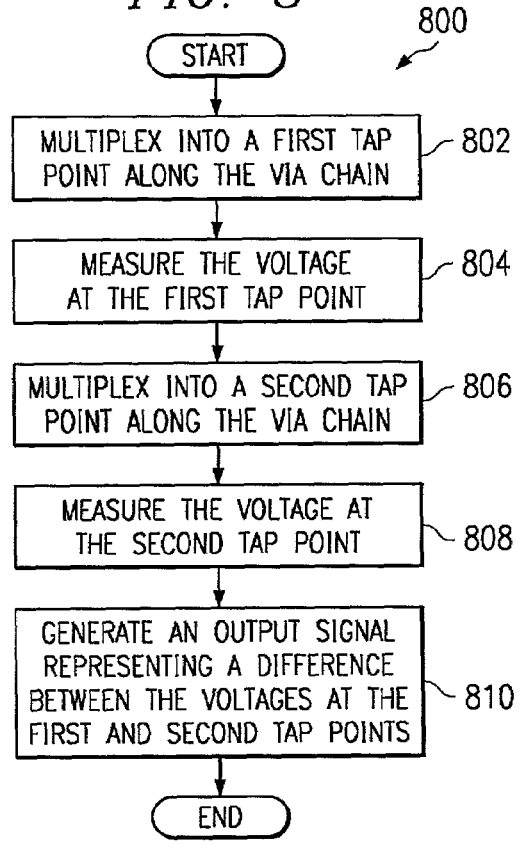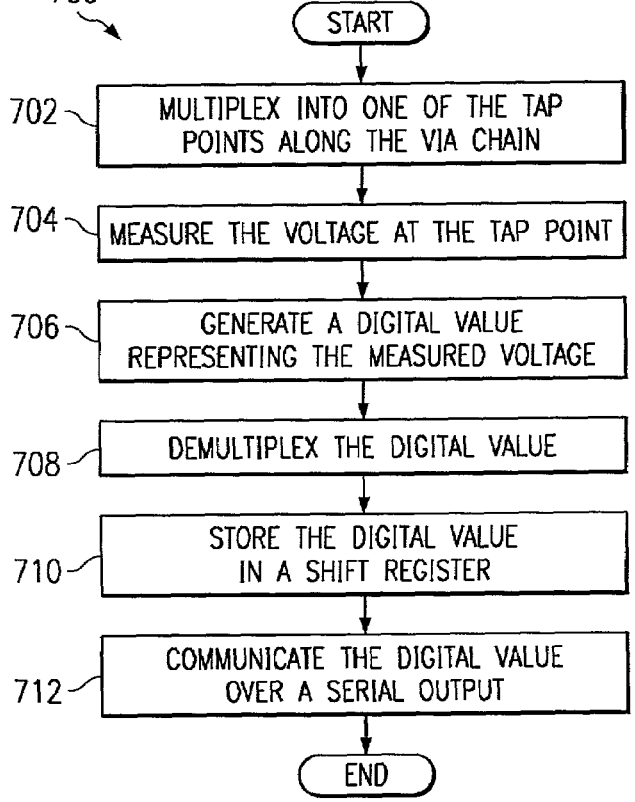

METHOD AND SYSTEM FOR DETECTING AN OUTLYING RESISTANCE IN A PLURALITY OF RESISTIVE ELEMENTS

This application claims priority under 35 USC § 119(e)(1) of provisional application No. 60/256,886 filed Dec. 19, 2000.

TECHNICAL FIELD OF THE INVENTION

This invention relates generally to the field of electronic devices, and more particularly to a method and system for detecting an outlying resistance in a plurality of resistive elements.

BACKGROUND OF THE INVENTION

Integrated circuits and other semiconductor devices often include long chains of vias, which are referred to as "via chains." A via may, for example, be a vertical metal interconnect between two planar metal layers. Each via in a via chain typically connects one conductive region to another conductive region. A via chain may include any number of vias, such as one thousand vias or more. After a manufacturer produces the semiconductor device, the via chain is typically tested to ensure that the vias have been manufactured properly.

One problem in the manufacture of the via chains is the presence of "open" vias. An "open" via typically fails to satisfactorily connect two conductive regions. Because of this, the via chain cannot conduct adequately from one end of the chain to the other end of the chain. The absence of a proper connection between two conductive regions in the chain prevents the via chain from operating properly.

Another problem in the manufacture of the via chains is the presence of "partially open" vias. A "partially open" via typically connects two conductive regions, but the resistance of the via is higher than expected. As a result, the via chain may be able to conduct from one end of the chain to the other end of the chain, but the higher resistance of the via may still interfere with the operation of the via chain.

Testing a via chain for open vias is often a simple task. To detect if a via chain includes any open vias, manufacturers typically measure the resistance of the entire via chain. If the resistance of the entire via chain is extremely or infinitely high, the via chain probably includes one or more open vias. Because current flow through the via chain is significantly restricted, the measured resistance appears extremely large.

Testing a via chain for partially open or resistive vias is typically a more difficult task. To test for partially open vias, manufacturers again typically measure the resistance of the entire via chain. Because each via typically has an expected resistance, the manufacturers can usually determine an expected resistance of the entire via chain. For example, vias may have an average resistance of between eight and twelve ohms, so a via chain having one thousand vias has an expected resistance of between eight thousand and twelve thousand ohms. By measuring the resistance of the entire via chain, the manufactures may be able to identify when a via chain contains a very high-resistance via, such as when a via has a resistance of one thousand ohms.

A problem with this approach is that the manufacturers may still fail to identify via chains containing vias that have much larger than expected resistances. For example, in the via chain having one thousand vias and an expected total resistance of between eight thousand and twelve thousand ohms, one via could have a resistance of one thousand ohms, while the other vias have expected or lower than expected resistances. Even though this one via is a partially open via, the resistance of the entire via chain could still fall within the expected resistance range. For instance, if each of the other vias has a resistance of nine ohms, the resistance of the entire via chain is approximately ten thousand ohms. This is within the expected resistance range for the entire chain. As a result, measuring the resistance of the entire via chain may fail to identify whether the chain has vias with much larger than expected resistances.

Another problem with this approach is that the manufacturers often cannot detect smaller variations in the resistances of the vias. For example, measuring the resistance of the entire via chain may fail to identify whether individual vias have a resistance of two or three times the expected resistance. These vias within operational circuits may still be an operating or reliability issue, but measuring the resistance of the entire chain may fail to identify those vias.

SUMMARY OF THE INVENTION

The present invention recognizes a need for an improved method and system for detecting an outlying resistance in a plurality of resistive elements. The present invention reduces or eliminates at least some of the shortcomings of prior systems and methods.

In one embodiment of the invention, a semiconductor die includes a plurality of resistive elements operable to receive a voltage differential between at least two of the resistive elements. The semiconductor die also includes a test circuit coupled to at least three tap points along the resistive elements. The test circuit is operable to measure a voltage at at least two of the tap points. A difference in the voltages between the at least two tap points is proportional to a resistance of the one or more resistive elements between the at least two tap points.

In another embodiment of the invention, a method for detecting an outlying resistance in at least one of a plurality of resistive elements includes applying a voltage differential between at least two of the resistive elements. The method also includes establishing at least three tap points along the resistive elements. The method further includes measuring a voltage at a plurality of the tap points along the resistive elements. In addition, the method includes determining if one or more resistive elements between two of the tap points are open or partially open based on the voltages at the two tap points.

Numerous technical advantages can be gained through various embodiments of the invention. Various embodiments of the invention may exhibit none, some, or all of the following advantages. For example, in one embodiment of the invention, a system is provided that allows a manufacturer to measure the resistance of each via or groups of vias in a via chain. For example, in particular embodiments, the system may sequentially test groups of one, five, or ten vias in the via chain. By reducing the number of vias tested in each group, the system may more accurately measure the resistance of an individual via or group of vias, which helps the system to identify open and partially open vias more effectively.

Some embodiments of the invention increase the likelihood that the manufacturer can identify vias that have much larger than expected resistances. For example, the system may test groups of one, five, or ten vias. By measuring the resistances of smaller groups of vias, a via having an extremely large resistance is easier to identify because the large resistance is not masked by the varying resistances of other vias in the via chain. The system is more likely to identify a via or a group of vias having a much larger than expected resistance. This allows manufacturers to more accurately identify when a via chain has an open or partially open via.

In addition, some embodiments of the invention allow manufacturers to detect smaller variations in the resistances of the vias. By testing the vias in smaller groups, such as in groups of one, five, or ten vias, smaller variations in the resistances of the vias are more easily identified. For example, the system may detect vias having resistances of two or three times the expected resistance.

Other technical advantages are readily apparent to one of skill in the art from the attached figures, description, and claims.

BRIEF DESCRIPTION OF THE DRAWINGS

For a more complete understanding of the present invention and the advantages thereof, reference is now made to the following descriptions taken in connection with the accompanying drawings, in which:

FIG. 6 is a flow diagram illustrating an exemplary method for detecting resistive vias in a via chain according to the teachings of the present invention;

FIG. 7 is a flow diagram illustrating an exemplary method for testing vias in a via chain according to the teachings of the present invention; and FIG. 8 is a flow diagram illustrating another exemplary method for testing vias in a via chain according to the teachings of the present invention.

DETAILED DESCRIPTION OF THE INVENTION

Figure 1A:
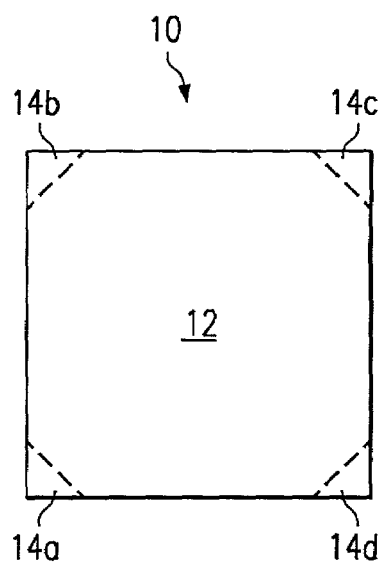
FIGS. 1a and 1b are block diagrams illustrating an exemplary semiconductor die constructed according to the teachings of the present invention.
Figure 1B:
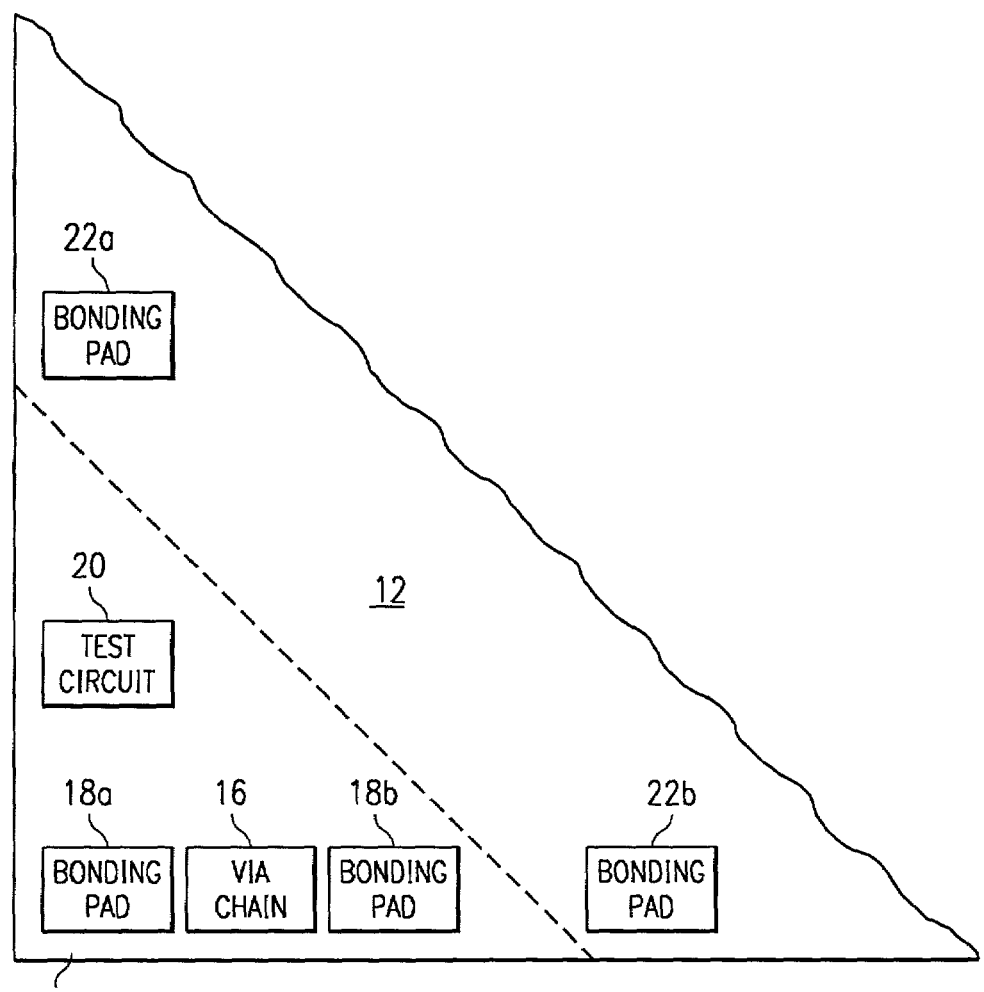

FIGS. 1a and 1b are block diagrams illustrating an exemplary semiconductor die 10 constructed according to the teachings of the present invention. FIG. 1a is a block diagram illustrating a semiconductor die 10, and FIG. 1b is a block diagram illustrating an enlarged portion of semiconductor die 10. In one embodiment of the invention, semiconductor die 10 includes a via chain 16 and a test circuit 20 for testing vias in via chain 16. Test circuit 20 is operable to test groups of vias in via chain 16, such as groups of one, five, or ten vias. By testing vias in via chain 16 in this way, test circuit 20 may more accurately detect faulty "partially open" vias, as well as identifying "open" vias. Although the present invention is described with respect to testing a via chain 16, other embodiments may be used without departing from the scope of the present invention. For example, test circuit 20 may be used to test any structure having a plurality of resistive elements, such as contacts, poly-silicon fuses, resistive diffusions, and various MOS configurations.

In the illustrated embodiment, semiconductor die 10 includes a die body 12. Die body 12 contains the integrated circuitry formed in semiconductor die 10. Die body 12 may, for example, contain circuitry used to form a microprocessor or other integrated circuit. Semiconductor die 10 also includes four die corners 14a–14d. One or more die corners 14 may contain test circuitry for testing the integrity of the integrated circuitry in die body 12. The sizes of each of die corners 14a–14d and the size of each corner 14 relative to the other corners 14 depicted in FIG. 1 are for illustration only.

Figure 3A:
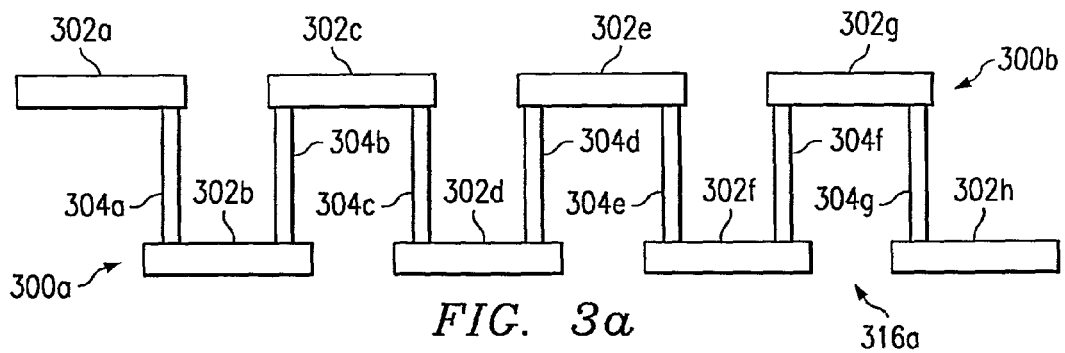
FIGS. 3a and 3b are cross-sectional views of exemplary via chains constructed according to the teachings of the present invention.
Figure 3B:
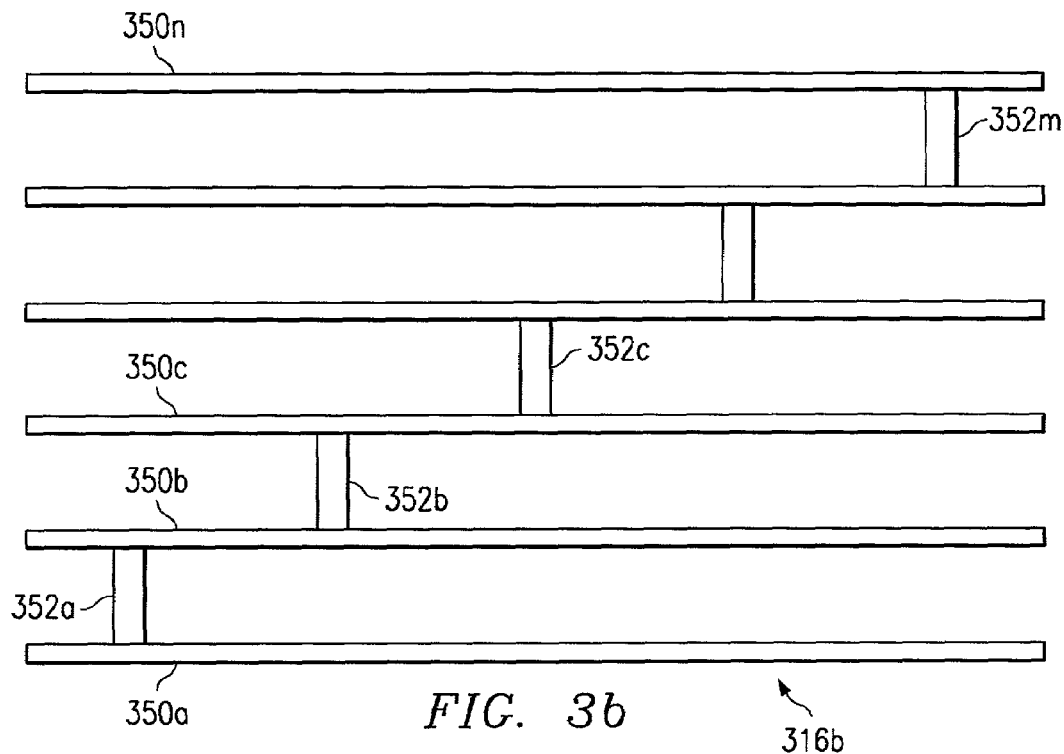

Die corner 14a includes a via chain 16 and a test circuit 20. Via chain 16 includes a plurality of conductive regions, and each conductive region is coupled to another conductive region by one or more vias. Each conductive region and each via in via chain 16 may be formed from any conductive material or materials, such as copper, aluminum, tungsten, and/or doped polysilicon. Exemplary via chains are illustrated in FIGS. 3a and 3b, which are described below. Although the invention is described with respect to via chain 16, other structures having a plurality of resistive elements may be used in system 10 without departing from the scope of the present invention.

Test circuit 20 is coupled to via chain 16. In this document, the term "couple" refers to any direct or indirect electrical connection between two or more elements, whether or not those elements are in physical contact with one another. Test circuit 20 is operable to test the vias in via chain 16 and facilitate the identification of vias having an outlying resistance. In this document, the term "outlying" refers to a resistance that deviates from an expected or normal resistance by more than a specified amount. The specified deviation can vary depending on the application. For example, in applications that require vias with close tolerances, test circuit 20 may help identify vias having a resistance that is, for example, 50% or 100% above the expected resistance. In other applications, test circuit 20 may help identify vias having a resistance that is, for example, 200% or 500% above the expected resistance. Any other suitable deviation may be used in system 10 without departing from the scope of the present invention.

Figure 4:
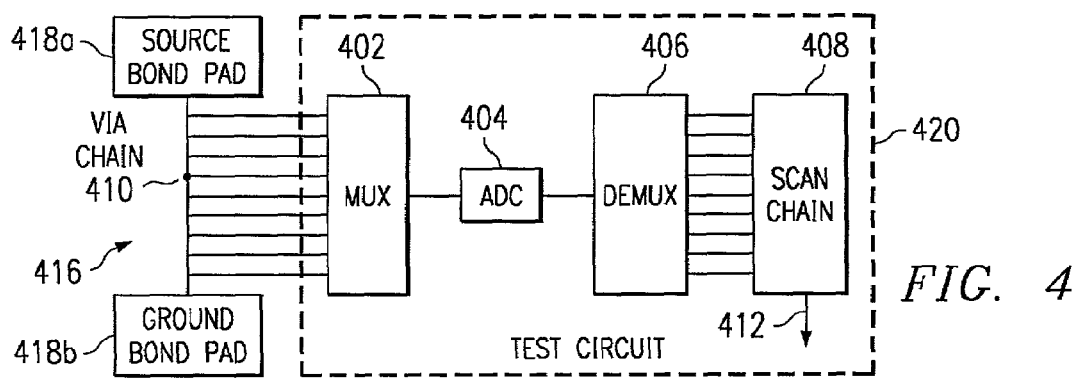
FIG. 4 is a block diagram illustrating an exemplary test circuit constructed according to the teachings of the present invention.
Figure 5:
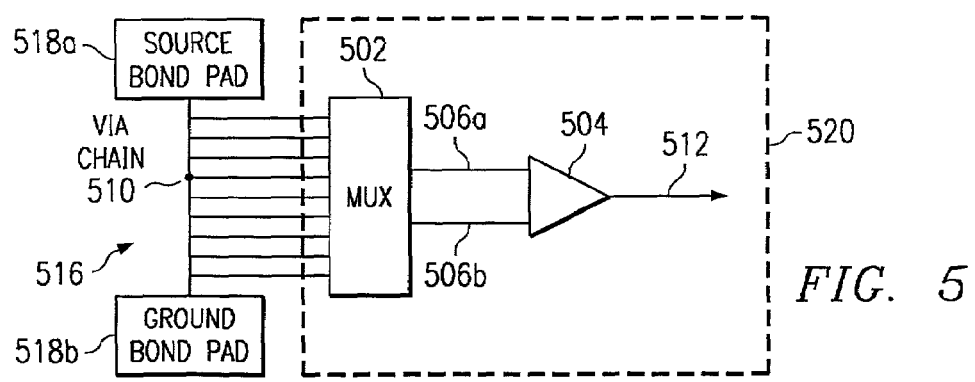
FIG. 5 is a block diagram illustrating another exemplary test circuit constructed according to the teachings of the present invention.

To test the vias in via chain 16, test circuit 20 may measure the voltages at different points along via chain 16, such as at points between groups of one, five, ten, or more vias. Test circuit 20 may also communicate the measured voltages to a testing board or other test circuitry coupled to test circuit 20. The testing board or other test circuitry may use the voltage drop between two points along via chain 16 to determine the resistance of the via or vias between the two points. By facilitating the measurement of the voltages at various points in via chain 16, test circuit 20 facilitates the identification of both "open" vias and "partially open" vias. Embodiments of exemplary test circuits are shown in FIGS. 4 and 5, which are described below.

In the illustrated embodiment, die corner 14a also includes bonding pads 18a and 18b. Each bonding pad 18 may be coupled to a portion of via chain 16. Bonding pads 18 could, for example, be coupled to opposite ends of via chain 16, although bonding pad 18 could also be coupled to any other portion of via chain 16. Each bonding pad 18 is operable to provide electrical connection between via chain 16 and an electrical probe when the probe comes in contact with bonding pad 18. In operation, a voltage differential may be established between bonding pads 18a and 18b, which establishes a voltage differential between two portions of via chain 16. For example, one probe can act as a voltage source, and one probe can act as a voltage drain. As one particular example, a probe contacting bonding pad 18a may act as a voltage source, providing a voltage signal to via chain 16. Another probe contacting bonding pad 18b may act as a ground, providing a voltage drain for via chain 16. By providing the voltage source and voltage drain, different voltages may form along via chain 16. Test circuit 20 may measure the voltages along via chain 16, and test circuit 20, a testing board, or other test circuitry may use the measured voltages to identify the resistance of the via or vias in via chain 16. Bonding pads 18 may comprise any suitable conductive material or materials operable to provide electrical connection between via chain 16 and an electrical probe.

Although FIG. 1 illustrates one embodiment of semiconductor die 10, numerous changes may be made without departing from the scope of the present invention. For example, although FIG. 1 illustrates die corner 14a as including two bonding pads 18, via chain 16 could also be coupled to one or more bonding pads 22 in die body 12. Also, although FIG. 1 illustrates via chain 16 and test circuit 20 residing within one die corner 14a, other die corners 14 may also contain a via chain and/or a test circuit.

Figure 2A:
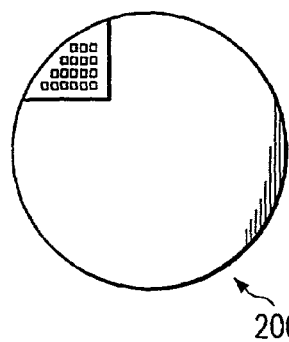
FIGS. 2a and 2b are block diagrams illustrating an exemplary semiconductor wafer constructed according to the teachings of the present invention.
Figure 2B:
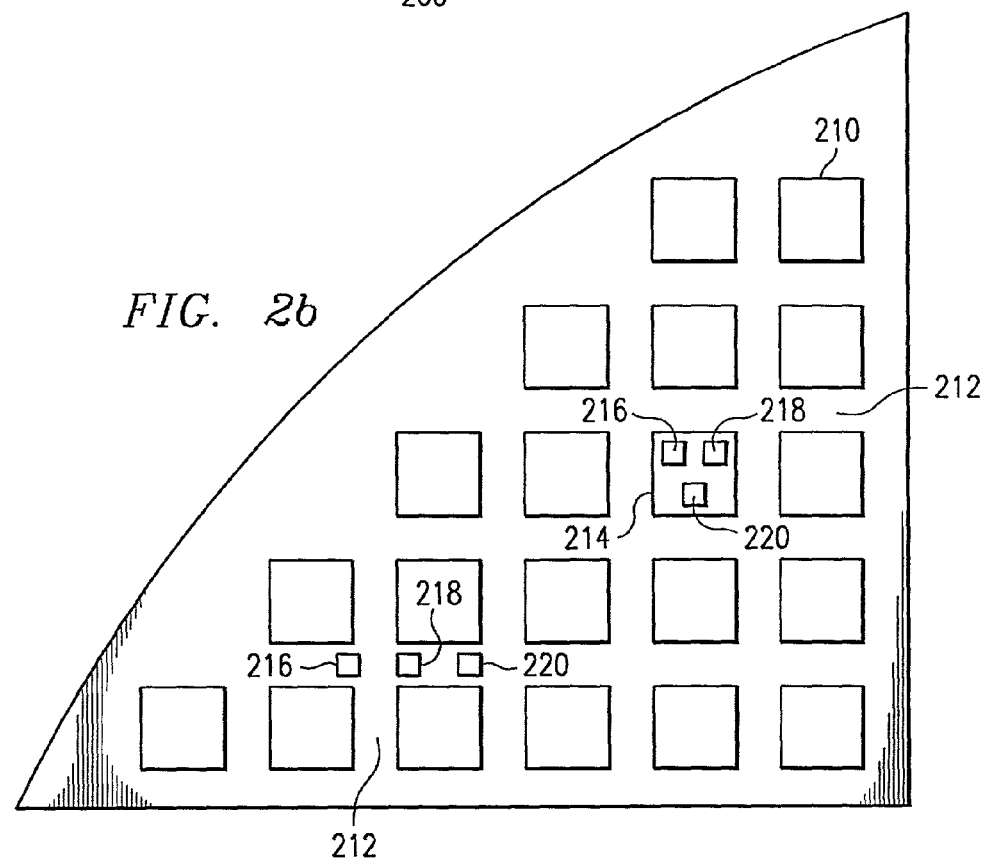

FIGS. 2a and 2b are block diagrams illustrating an exemplary semiconductor wafer 200 constructed according to the teachings of the present invention. FIG. 2a is a block diagram illustrating a wafer 200, and FIG. 2b is a block diagram illustrating an enlarged portion of wafer 200. In the illustrated embodiment, wafer 200 includes a plurality of semiconductor dies 210 separated by scribe lines 212. Scribe lines 212 represent areas where wafer 200 will be cut to remove semiconductor dies 210 from wafer 200. Wafer 200 may also include one or more process control modules 214. Process control modules 214 represent areas of wafer 200 that contain test circuitry for semiconductor dies 210 and/or wafer 200.

In one embodiment, semiconductor die 210 may be the same or similar to semiconductor die 10 shown in FIG. 1. In another embodiment, one or more via chains 216, bonding pads 218, and/or test circuits 220 may be formed in scribe lines 212 and/or process control modules 214. In this embodiment, semiconductor die 210 may or may not include a via chain 216, bonding pads 218, and/or a test circuit 220. Via chain 216, bonding pad 218, and test circuit 220 may be the same or similar to via chain 16, bonding pad 18 or 22, and test circuit 20, respectively, from FIG. 1.

Although FIG. 2a illustrates semiconductor dies 210 only in a portion of semiconductor wafer 200, wafer 200 may include any number and/or arrangement of semiconductor dies 210. Also, semiconductor dies 210 may be positioned in any suitable location in wafer 200.

FIGS. 3a and 3b are cross-sectional views of exemplary via chains constructed according to the teachings of the present invention. FIG. 3a illustrates a via chain 316a, and FIG. 3b illustrates a via chain 316b. Via chains 316a and 316b may be useful, for example, in semiconductor die 10 of FIG. 1 and/or semiconductor wafer 200 of FIG. 2.

In FIG. 3a, via chain 316a includes two layers 300a and 300b. Each layer 300 includes a plurality of conductive plates 302. In this document, the term "plate" may refer to any uniformly or nonuniformly shaped, at least substantially conductive structure. Each plate 302 is coupled to at least one other plate 302 by a via 304. Plates 302 may be formed from any conductive material or combination of conductive materials including, for example, copper, aluminum, tungsten, and/or doped polysilicon. Plates 302 may also have one or multiple layers.

Each via 304 couples one plate 302 to another plate 302. Vias 304 may be formed from any conductive material or combination of conductive materials, such as copper, aluminum, tungsten, and/or doped polysilicon. Vias 304 may also have one or multiple layers.

In FIG. 3b, via chain 316b includes a plurality of layers 350a–350n. Each layer 350 is coupled to at least one other layer 350 by a via 352. Layers 350 may be formed from any conductive material or combination of conductive materials, such as copper, aluminum, tungsten, and/or doped polysilicon. Each layer 350 may also have one or multiple layers of conductive material.

Each via 352 couples a layer 350 to another layer 350. Vias 352 may be formed from any conductive material or combination of conductive materials including, for example, copper, aluminum, tungsten, and/or doped polysilicon. Vias 352 may also have one or multiple layers.

Although FIGS. 3a and 3b illustrate different embodiments of a via chain, other embodiments of a via chain may be used without departing from the scope of the present invention. For example, a via chain could comprise a combination of via chains 316a and 316b. In this embodiment, the via chain could include multiple levels as shown in FIG. 3b, and each level could include a via chain as shown in FIG. 3a.

FIG. 4 is a block diagram illustrating an exemplary test circuit 420 constructed according to the teachings of the present invention. In the illustrated embodiment, test circuit 420 includes a multiplexer (MUX) 402, an analog-to-digital converter (ADC) 404, a demultiplexer (DEMUX) 406, and a scan chain 408.

Multiplexer 402 is coupled to analog-to-digital converter 404. Multiplexer 402 is also coupled to at least three tap points 410 along via chain 416. In one embodiment, two of the tap points 410 could reside at opposite ends of via chain 416, although tap points 410 could reside at any location along via chain 416. Multiplexer 402 is operable to identify the voltage at each tap point 410 along via chain 416 and to communicate the voltage to analog-to-digital converter 404. Multiplexer 402 may use an internal or external clock signal to multiplex into the tap points 410 in via chain 416. Multiplexer 402 may comprise any hardware, software, firmware, or combination thereof operable to multiplex into the tap points 410 on via chain 416.

Analog-to-digital converter 404 is coupled to multiplexer 402 and demultiplexer 406. Analog-to-digital converter 404 is operable to receive the voltage signals from multiplexer 402. Analog-to-digital converter 404 is also operable to convert the voltage signals into digital values and to communicate the digital values to demultiplexer 406. Analog-to-digital converter 404 may comprise any hardware, software, firmware, or combination thereof operable to convert analog voltage signals into digital signals. In one embodiment, analog-to-digital converter 404 generates a digital signal containing ten-bit digital values.

Demultiplexer 406 is coupled to analog-to-digital converter 404 and scan chain 408. Demultiplexer 406 is operable to receive the digital values produced by analog-to-digital converter 404. Demultiplexer 406 is also operable to demultiplex the digital values, identifying which tap point 410 corresponds to the digital value. Demultiplexer 406 is further operable to communicate the digital value to scan chain 408 based on the tap point 410 that corresponds to the digital value. Demultiplexer 406 may use an internal or external clock signal to demultiplex the digital values received from analog-to-digital converter 404. Demultiplexer 406 may comprise any hardware, software, firmware, or combination thereof operable to demultiplex digital values.

Scan chain 408 is coupled to demultiplexer 406. Scan chain 408 receives and stores the digital values generated by analog-to-digital converter 404. Scan chain 408 also communicates the digital values as an output signal 412 to a testing pad or other circuit coupled to scan chain 408. Scan chain 408 may comprise any hardware, software, firmware, or combination thereof operable to store and communicate digital values. In one embodiment, scan chain 408 includes a shift register operable to store the digital values. After communicating one of the digital values from the shift register in output signal 412, scan chain 408 shifts the values in the shift register. This makes room in the shift register for the next digital value from analog-to-digital converter 404.

In one aspect of operation, a probe provides a voltage supply at bonding pad 418a, and another probe provides a voltage drain at bonding pad 418b. If no open vias exist in via chain 416, the voltage source and voltage drain cause a current to flow through via chain 416. This generates different voltage levels at tap points 410 in via chain 416. Multiplexer 402 identifies the voltage levels at the tap points 410 along via chain 416. For each tap point 410, multiplexer 402 communicates the voltage to analog-to-digital converter 404, which generates a digital value representing the voltage level. Analog-to-digital converter 404 communicates the digital value to demultiplexer 406. Demultiplexer 406 demultiplexes the digital value, identifying which tap point 410 corresponds to the digital value. Demultiplexer 406 communicates the digital value to scan chain 408 based on the identified tap point 410, and scan chain 408 stores and communicates the values to a testing pad or other circuitry in output signal 412. The testing pad may use the digital values to determine if at least one via between two consecutive or nonconsecutive tap points 410 is open or partially open. For example, the testing pad may analyze the digital values to determine if a voltage drop between two tap points 410 indicates that a via has a larger than expected resistance.

FIG. 5 is a block diagram illustrating another exemplary test circuit 520 constructed according to the teachings of the present invention. In the illustrated embodiment, test circuit 520 includes a multiplexer (MUX) 502 and a difference amplifier 504.

Multiplexer 502 is coupled to difference amplifier 504. Multiplexer 502 is also coupled to at least three tap points 510 along via chain 516. Multiplexer 502 is operable to identify the voltage at each tap point 510 along via chain 516. Multiplexer 502 is also operable to communicate two of the voltage levels to difference amplifier 504 through outputs 506a and 506b. In one embodiment, multiplexer 502 outputs the voltage from two consecutive tap points 510. For example, multiplexer 502 may output the voltage of tap point 510d on output 506a and the voltage of tap point 510e on output 506b. In another embodiment, multiplexer 502 may output the voltage from two nonconsecutive tap points 510. Multiplexer 502 may use an internal or external clock signal to multiplex into the tap points 510 in via chain 516. Multiplexer 502 may comprise any hardware, software, firmware, or combination thereof operable to multiplex into the tap points 510 and output two values.

Difference amplifier 504 is coupled to multiplexer 502. Difference amplifier 504 is operable to receive the identified voltage levels from multiplexer 502. Difference amplifier 504 is also operable to determine and amplify a difference between the voltages, generating an output signal 512. Difference amplifier 504 may communicate the output signal 512 to a testing pad or other circuit coupled to test circuit 520. Difference amplifier 504 may comprise any hardware, software, firmware, or combination thereof operable to receive and determine a difference between voltage signals.

In one aspect of operation, a probe provides a voltage supply at bonding pad 518a, and another probe provides a voltage drain at bonding pad 518b. If no open vias exist in via chain 516, the voltage source and voltage drain cause a current to flow through via chain 516. This generates different voltage levels at tap points 510 in via chain 516. Multiplexer 502 identifies the voltage levels at the tap points 510 along via chain 516 and communicates two of the measured voltages to difference amplifier 504. Difference amplifier 504 generates an output signal 512 that represents the difference between the voltages at the two tap points 510, and difference amplifier 504 communicates the signal 512 to a testing pad or other circuitry. If a via or vias between the two tap points 510 are partially open, the output signal 512 generated by difference amplifier 504 will be larger than expected. The testing pad or other circuitry may compare the output signal 512 to an expected level to determine if a via in via chain 516 is partially open.

FIG. 6 is a flow diagram illustrating an exemplary method 600 for detecting a resistive via in a via chain according to the teachings of the present invention. Although method 600 is described as it relates to semiconductor die 10, the same or similar method may be used in semiconductor wafer 200.

A first probe contacts a first bonding pad at step 602. This may include, for example, the probe contacting a bonding pad 18 or 22 in semiconductor die 10. This may also include providing a voltage source through the bonding pad. A second probe contacts a second bonding pad at step 604. This may include, for example, the probe contacting bonding pad 18 or 22. This may also include providing a voltage drain through the bonding pad. In any event, a voltage differential is established between the bonding pads. Voltages are measured at a plurality of tap points along the via chain at step 606. This may include, for example, test circuit 20 identifying the voltages at tap points along via chain 16. The system determines if a via or vias between two tap points are open or partially open at step 608. In one embodiment, test circuit 20 outputs the identified voltages to a testing pad or other circuitry. The testing pad or other circuitry may receive the voltages and determine if a voltage drop exists across one via or a group of vias that is larger than a reference voltage. This could indicate that one or more vias between the tap points may be open or partially open.

In another embodiment, test circuit 20 generates an output signal which represents the difference in voltage between two tap points. A testing pad or other circuitry may then compare the difference to an expected difference. A larger than expected difference could indicate that one or more vias between the tap points may be open or partially open.

FIG. 7 is a flow diagram illustrating an exemplary method 700 for testing vias in a via chain according to the teachings of the present invention. Test circuit 420 multiplexes into one of the tap points 410 along via chain 416 at step 702. This may include, for example, multiplexer 402 selecting the tap point 410 under the control of a clock signal. Test circuit 420 measures the voltage at the first tap point at step 704. This may include, for example, multiplexer 402 identifying the voltage at tap point 410 and communicating that voltage level to analog-to-digital converter 404. Test circuit 420 generates a digital value representing the voltage at step 706. This may include, for example, analog-to-digital converter 404 receiving the voltage from multiplexer 402 and generating a digital value representing the voltage.

Test circuit 420 demultiplexes the digital value at step 708. This may include, for example, demultiplexer 406 receiving the digital value from analog-to-digital converter 404. This may also include demultiplexer 406 demultiplexing the digital value under the control of a clock signal. Test circuit 420 stores the digital value in a shift register at step 710. This may include, for example, scan chain 408 receiving the digital value from demultiplexer 406 and storing the digital value in a shift register in scan chain 408. Test circuit 420 communicates the digital value in an output signal 412 at step 712. This may include, for example, scan chain 408 communicating one of the values in the shift register in output signal 412, and shifting the remaining values in the shift register. In one embodiment, the output signal 412 of scan chain 408 comprises a serial output.

FIG. 8 is a flow diagram illustrating another exemplary method 800 for testing vias in a via chain according to the teachings of the present invention. Test circuit 520 multiplexes into a first tap point 510 along the via chain 516 at step 802. This may include, for example, multiplexer 502 selecting the first tap point 510 under the control of a clock signal. Test circuit 520 measures the voltage at the first tap point 510 at step 804. This may include, for example, multiplexer 502 identifying the voltage that appears at the first tap point 510. Test circuit 520 multiplexes into a second tap point 510 along via chain 516 at step 806. This may include, for example, multiplexer 502 selecting a consecutive or nonconsecutive tap point 510 along via chain 516. Test circuit 520 measures the voltage at the second tap point 510 at step 808. This may include, for example, multiplexer 502 identifying the voltage at the second tap point 510.

Test circuit 520 generates an output signal 512 representing the difference between the voltages at step 810. This may include, for example, multiplexer 502 communicating the two voltages to difference amplifier 504. This may also include difference amplifier 504 generating the output signal 512, which represents the difference between the voltages 506a and 506b output by multiplexer 502.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A semiconductor die, comprising:
   a plurality of resistive elements coupled to each other in a chain, the resistive elements operable to receive a voltage differential between at least two of the resistive elements; and
   a test circuit within the semiconductor die coupled to at least three tap points along the resistive elements, the test circuit operable to measure a voltage at at least two of the tap points, a difference in the voltages between the at least two tap points is proportional to a resistance of the one or more resistive elements between the at least two tap points.

2. The semiconductor die of claim 1, wherein the test circuit comprises:
   a multiplexer coupled to the tap points, the multiplexer operable to select the tap points and to identify the voltages at the selected tap points;
   an analog-to-digital converter coupled to the multiplexer, the analog-to-digital converter operable to receive the voltages from the multiplexer and to convert the voltages into digital values;
   a demultiplexer coupled to the analog-to-digital converter, the demultiplexer operable to receive the digital values and to demultiplex the digital values; and
   a scan chain coupled to the demultiplexer, the scan chain operable to receive the digital values and to communicate the digital values over an output.

3. The semiconductor die of claim 1, wherein the test circuit comprises:
   a multiplexer coupled to the tap points, the multiplexer operable to select the tap points and to identify the voltages at the selected tap points; and
   a difference amplifier coupled to the multiplexer, the difference amplifier operable to receive two voltages from the multiplexer and to generate an output signal representing a difference between the two voltages.

4. The semiconductor die of claim 1, wherein a tap point exists between each resistive element.

5. The semiconductor die of claim 1, wherein the resistive elements comprise vias.

6. The semiconductor die of claim 1, further comprising:
   a first bonding pad coupled to one of the resistive elements; and
   a second bonding pad coupled to another of the resistive elements.

7. A semiconductor wafer, comprising:
   at least one semiconductor die;
   a plurality of resistive elements coupled to each other in a chain, the resistive elements operable to receive a voltage differential between at least two of the resistive elements; and
   a test circuit within the semiconductor wafer coupled to at least three tap points along the resistive elements, the test circuit operable to measure a voltage at at least two of the tap points, a difference in the voltages between the at least two tap points proportional to a resistance of the one or more resistive elements between the at least two tap points.

8. The semiconductor wafer of claim 7, wherein the test circuit comprises:
   a multiplexer coupled to the tap points, the multiplexer operable to select the tap points and to identify the voltages at the selected tap points;
   an analog-to-digital converter coupled to the multiplexer, the analog-to-digital converter operable to receive the voltages from the multiplexer and to convert the voltages into digital values;
   a demultiplexer coupled to the analog-to-digital converter, the demultiplexer operable to receive the digital values and to demultiplex the digital values; and
   a scan chain coupled to the demultiplexer, the scan chain operable to receive the digital values and to communicate the digital values over an output.

9. The semiconductor wafer of claim 7, wherein the test circuit comprises:
   a multiplexer coupled to the tap points, the multiplexer operable to select the tap points and to identify the voltages at the selected tap points; and
   a difference amplifier coupled to the multiplexer, the difference amplifier operable to receive two voltages from the multiplexer and to generate an output signal representing a difference between the two voltages.

10. The semiconductor wafer of claim 7, wherein the resistive elements are located in one of the semiconductor die, a scribe line on the semiconductor wafer, and a process control module on the semiconductor wafer.

11. The semiconductor wafer of claim 7, wherein the resistive elements comprise vias.

12. The semiconductor wafer of claim 7, further comprising:
   a first bonding pad coupled to one of the resistive elements; and
   a second bonding pad coupled to another of the resistive elements.

13. A method for detecting an outlying resistance in at least one of a plurality of resistive elements coupled to each other in a chain within a semiconductor wafer, comprising:

applying a voltage differential between at least two of the resistive elements within the semiconductor wafer;

establishing at least three tap points along the resistive elements;

measuring a voltage at a plurality of the tap points along the resistive elements; and determining if one or more resistive elements between two of the tap points are open or partially open based on the voltages at the two tap points.

14. The method of claim 13, wherein measuring a voltage at a plurality of the tap points comprises:

multiplexing into selected tap points along the resistive elements; and identifying the voltages at the selected tap points.

15. The method of claim 14, further comprising:

converting the voltages into digital values;

demultiplexing the digital values;

storing the demultiplexed digital values; and generating an output signal comprising the digital values.

16. The method of claim 14, further comprising generating an output signal comprising a difference between two of the voltages.

17. The method of claim 13, wherein a tap point exists between each resistive element.

18. The method of claim 13, wherein the resistive elements comprise a chain of resistive elements; and wherein applying a voltage differential between at least two of the resistive elements comprises applying a voltage differential between a first end and a second end of the chain.

19. The method of claim 13, wherein the resistive elements comprise vias.

20. The method of claim 13, wherein the resistive elements are located in one of a semiconductor die, a scribe line on a semiconductor wafer, and a process control module on the semiconductor wafer.

* * * * *